(12) United States Patent
Jiang

(10) Patent No.: US 7,764,091 B2
(45) Date of Patent: Jul. 27, 2010

(54) SQUARE TO PSEUDO-SINUSOIDAL CLOCK CONVERSION CIRCUIT AND METHOD

(75) Inventor: Xuewen Jiang, Chandler, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 12/183,550

(22) Filed: Jul. 31, 2008

(65) Prior Publication Data

US 2010/0026349 A1 Feb. 4, 2010

(51) Int. Cl.
*H03B 28/00* (2006.01)
(52) U.S. Cl. .................................................. 327/129
(58) Field of Classification Search ................. 327/129
See application file for complete search history.

(56) References Cited

U.S. PATENT DOCUMENTS

| | | | | |
|---|---|---|---|---|
| 3,774,115 | A | * | 11/1973 | Greiner ........................ 327/129 |
| 3,940,635 | A | * | 2/1976 | Meyer ......................... 327/105 |
| 3,982,189 | A | * | 9/1976 | Brooks et al. ................ 327/129 |
| 4,250,455 | A | | 2/1981 | Davis |
| 5,151,624 | A | | 9/1992 | Stegherr et al. |
| 5,625,318 | A | | 4/1997 | Sevenhans et al. |
| 5,945,860 | A | | 8/1999 | Guay et al. |
| 6,943,606 | B2 | | 9/2005 | Dunning et al. |
| 7,298,195 | B2 | | 11/2007 | Freyman et al. |
| 7,315,596 | B2 | | 1/2008 | Payne et al. |
| 7,579,891 | B2 | | 8/2009 | Ebner |

OTHER PUBLICATIONS

Shin, Soon-Kyun et al.; "Slew-Rate-Controlled Output Driver Having Constant Transition Time Over Process, Voltage, Temperature, and Output Load Variations"; IEEE Transactions on Circuits and Systems; Jul. 2007; pp. 601-605; vol. 54, No. 7; IEEE.
Zhu, Qing K. et al.; "Delay/Slope Bugeting for Clock Buffer Cell Design"; 8th IEEE International Conference on Electronics, Circuits, and Systems; 2001; pp. 417-420; IEEE.

(Continued)

*Primary Examiner*—Lincoln Donovan
*Assistant Examiner*—Khareem E Almo

(57) ABSTRACT

A square wave to pseudo-sinusoidal clock conversion circuit comprises first and second stages. The first stage includes a cross-coupled differential pairs input gain stage having positive and negative input sides. Responsive to a differential square wave clock input, the first stage provides a first pass balanced differential clock with pull-up and pull-down symmetry. The second stage comprises positive and negative output side push-pull with low pass filter circuits, wherein the positive and negative output side push-pull with low pass filter circuits are responsive to the first pass balanced differential clock from the first stage for producing an output pseudo-sinusoidal clock that comprises a nearly sinusoidal output with slew rate controlled and clock waveform pull-up and pull-down symmetry for each of a respective one of the positive and negative output sides.

15 Claims, 4 Drawing Sheets

SLEW-RATE CONTROLLED BUFFER SQUARE TO PSEUDO-SINUSOIDAL CLOCK CONVERSION CIRCUIT

OTHER PUBLICATIONS

Heydari, Payam et al.; "Design of Ultra High-Speed CMOS CML Buffers and Latches"; Proceedings of the 2003 International Symposium on Circuits and Systems; May 25-28, 2003; pp. II-208 thru II-211; IEEE.

Bulzacchelli, John F. et al.; "A 10-Gb/s 5-Tap DFE/4-Tap FFE Transceiver in 90-nm CMOS Technology"; IEEE Journal of Solid State Circuits; Dec. 2006; pp. 2885-2900; vol. 41, No. 12; IEEE.

Jiang, Yueming et al.; "A Compact Phase Interpolator for 3.125G Serdes Application"; Southwest Symposium on Mixed Signal Design, Feb. 23-25 2003; pp. 249-252; IEEE.

Office Action mailed Dec. 21, 2009 on Related U.S. Appl. No. 12/182,563.

* cited by examiner

SQUARE TO PSEUDO-SINUSOIDAL CLOCK CONVERSION CIRCUIT AND METHOD

BACKGROUND

1. Field

This disclosure relates generally to clock circuits, and more specifically, to a square to pseudo-sinusoidal clock conversion circuit and method.

2. Related Art

In high speed data communication systems, there are many building blocks that require sinusoidal clock inputs to ensure analog performance of the block. For example, in quadrature mixing based phase interpolator circuit, it is very desirable to have sinusoidal clock inputs, as the sinusoidal clocks can have maximum clock edge overlap between in-phase clock (clock I) and quadrature-phase clock (clock Q) and proper phase interpolation can then be realized between input clock I phase and input clock Q phase. Another example, in analog multiplier based sinusoidal phase detector circuit, as widely used in frequency synthesizers, it is also very desirable to have sinusoidal clock inputs from a reference clock and from a feedback divider clock, as the multiplication between two sinusoidal clocks has much higher spectral purity and after being fed into a loop filter, lower phase noise or clock jitter can be realized at the frequency synthesizer final output. However, as CMOS (complementary metal oxide semiconductor) and CML (current mode logic) topology are widely used in high speed digital systems, which only output square-wave like clocks and are unsymmetrical in clock signal pull-up and pull-down, designing high performance analog blocks is usually avoided due to a lack of sinusoidal clocks. In addition, such analog blocks usually require a higher system level budget for the respective blocks. Furthermore, LC resonator circuits could be used for sinusoidal clock generation, however such circuits usually introduce process compatibility and large silicon area concerns due to a need for an on-die inductor device.

Accordingly, there is a need for an improved method and apparatus for overcoming the problems in the art as discussed above.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

The square to pseudo-sinusoidal clock conversion circuit according to the embodiments of the present disclosure is suitable, for example, for use in the design of a 64-step 2.5 to 3.125 GHz phase interpolator (PI), such as can be implemented in 45 nm CMOS SOI technology. In one embodiment, a high speed clock from a phase locked loop (PLL) is differential and full rate, 5.0 to 6.25 GHz, which is divided-by-2 to generate 4-phase half rate clocks. The 4-phase half rate clocks are buffered and slew rate controlled by a pair of the embodiments of the present disclosure, one embodiment for clock I and one for clock Q, to ensure adequate overlap of the clock I and clock Q edges being interpolated. The phase interpolator circuit takes phase control codes and pseudo-sinusoidal clocks from the paired embodiments' outputs as clock I and clock Q and performs quadrature mixing to generate 64 phase steps across two unit intervals (2UI).

Figure 1:
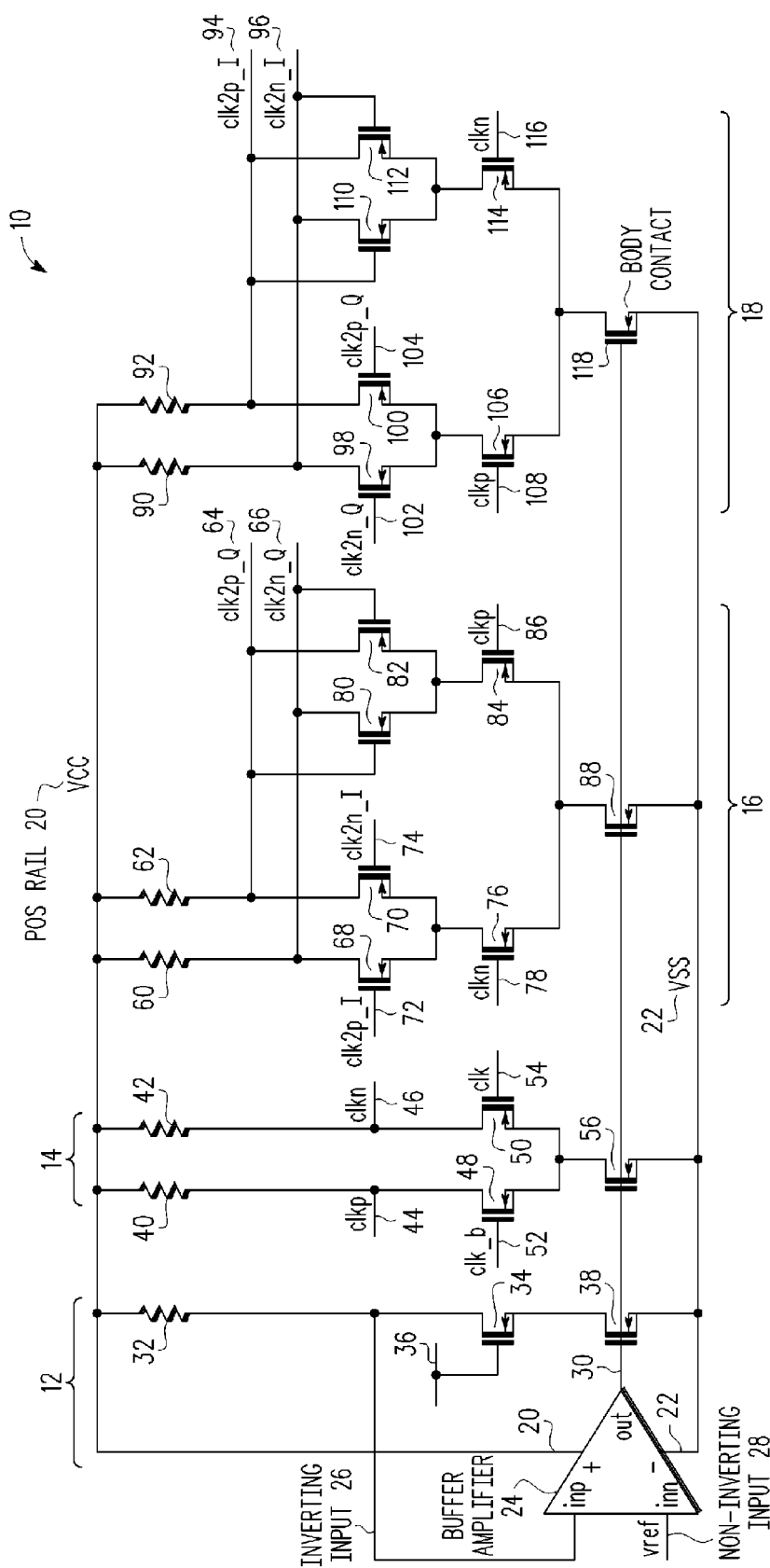
FIG. 1 is an illustrative circuit diagram view of an example quadrature phase clocks generation circuit comprising a current mode logic (CML) buffer and divide-by-two circuit with replica bias for use with the embodiments of the present disclosure.

FIG. 1 is an illustrative circuit diagram view of an example quadrature phase clocks generation circuit 10. Circuit 10 comprises a current mode logic (CML) buffer and divide-by-two circuit with replica bias for use with the embodiments of the present disclosure. The divide-by-two circuit is configured for quadrature-phased clocks generation. Current-mode logic (CML) buffer and latches are selected for speed and supply noise considerations. All CML are biased by a replica biasing as shown in FIG. 1 for immunity of CML swing to PVT variations. In one embodiment, the CML swing is designed to be on the order of forty percent (40%) of supply voltage as a tradeoff between (i) devices staying in saturation and (ii) noise margin of logic states. Phase I clock output is triggered by full rate clock rising edge with phase Q clock polarity inverted at latch input. In this way, the phase I clock rising edge is guaranteed leading the Q clock rising edge, consistent with commonly used phase nomenclature in a quadrature mixing based interpolator core. In one embodiment, all switching devices are using minimum channel length devices, and all matching devices are using body-contact devices to reduce floating-body effects and signal pattern dependent threshold voltage (Vt) variations in CMOS SOI technology.

In connection with the quadrature phased clocks generation circuit 10, a full rate high speed differential clock is first buffered by a CML buffer, and then the buffered differential clock drives the CML divide-by-2 circuit. The divide-by-2 circuit comprises two CML latches of opposite input clock polarities, wherein a first latch's data output is inverted before being fed into the second latch's data input, and the second latch's data output is non-inverted before being fed into the first latch's data input. To be consistent with commonly used phase nomenclature, phase I clock output is triggered by full rate clock rising edge with phase Q clock inverted at latch input. The resultant phase I clock rising edge is always leading the Q clock rising edge and there is no phase ambiguity across PVT's. All CML circuits have output swings referenced to Vcc. All CML circuits have tail currents mirrored from a replica bias circuit, which consists of a simple amplifier with a $2^{nd}$ gain stage in common source configuration. The $2^{nd}$ gain stage is a replica of CML buffer with input being high. For example, if Vref=0.6*Vcc, which can be precisely generated by supply resistor divider, replica bias negative feedback mechanism will make replica stage tail current equal to 0.4*Vcc divided by load resistance of replica stage. Since all other CML circuits are scaled from the same replica stage, that is, if CML circuits tail currents are n times larger, then load resistors are n times smaller, and all CML output swings equal to 0.4*Vcc, which is the same as the designed voltage drop across the load resistor in replica stage. This way, CML output swing can be designed immune to PVT variations, its value is only decided by the design parameter of Vref to Vcc ratio. Circuit 10 is further explained in the following.

Circuit 10 includes a replica bias circuit portion or stage 12, a CML clock buffer circuit portion or stage 14, a CML latch triggered inverted full rate high speed clock circuit portion of stage 16, and a CML latch triggered non-inverted full rate high speed clock circuit portion or stage 18. Circuit portions 12, 14, 16, and 18 are each coupled between supply voltage (Vcc) node 20 and ground voltage (Vss) node 22.

Replica bias circuit 12 comprises a simple amplifier 24 with a second gain stage in common source configuration, wherein the two stages together form negative feedback and set the voltage at inverting input node 26 equal to the voltage at non-inverting input node 28. More particularly, replica bias circuit portion 12 includes a buffer amplifier 24 coupled between supply voltage 20 and ground voltage 22, further having a positive (non-inverting) input node 26, a negative (inverting) input node 28, and a positive output node 30. Buffer amplifier 24 comprises a single stage amplifier that represents a first part of the replica bias circuit 12. Replica bias circuit portion 12 further includes a load resistor 32 of the replica stage, coupled between the supply voltage Vcc 20 and the inverting input node 26 of amplifier 24. Replica bias circuit portion 12 still further includes an NMOS transistor 34 having its input 36 coupled to the supply voltage Vcc 20, and further having its source/drain terminals coupled between the inverting input node 26 and a second NMOS transistor 38. NMOS transistor 38 is configured to control a tail current of the replica stage 12, wherein its input is coupled to the output node 30 of amplifier 24, and further having its source/drain terminals coupled between a source/drain terminal of NMOS transistor 34 and ground voltage Vss 22.

In this configuration, i.e., with its input being tied to Vcc in the replica bias circuit or stage 12, NMOS transistor 34 is configured to mimic a clock input transistor in the CML clock buffer circuit portion or stage 14. In addition, NMOS transistor 34 gate input 36 tied to Vcc is configured to mimic the CML clock buffer circuit or stage 14 having a logic high input.

CML clock buffer circuit portion or stage 14 includes positive and negative input sides and positive and negative output sides. For example, CML clock buffer 14 includes positive output side CML load resistor 40 and negative output side CML load resistor 42. CML load resistor 40 is coupled between supply voltage Vcc 20 and the positive output side node 44 (clkp) of CML clock buffer 14. CML load resistor 42 is coupled between supply voltage Vcc 20 and the negative output side node 46 (clkn) of CML clock buffer 14. Clock buffer 14 further includes negative input side NMOS transistor 48, positive input side NMOS transistor 50, and tail current NMOS transistor 56. NMOS transistor 48 has its input 52 coupled to a negative clock input supply (clk_b), and further having its source/drain terminals coupled between the positive output side node 44 and NMOS transistor 56. NMOS transistor 50 has its input 54 coupled to a positive clock input supply (clk), and further having its source/drain terminals coupled between the positive output side node 44 and NMOS transistor 56. NMOS transistor 56 is configured to control a tail current of the clock buffer stage 14, wherein its input is coupled to the output node 30 of amplifier 24, and further having its source/drain terminals coupled between (i) a common connection of source/drain terminals of NMOS transistors 48 and 50 and (ii) ground voltage Vss 22.

CML latch triggered inverted full rate high speed clock circuit portion or stage 16 includes positive and negative input sides and positive and negative output sides. For example, CML latch triggered inverted full rate high speed clock circuit portion 16 includes negative output side CML load resistor 60 and positive output side CML load resistor 62. CML load resistor 60 is coupled between supply voltage Vcc 20 and the negative output side node (clk2n_Q) 66 of latch triggered inverted clock circuit 16. CML load resistor 62 is coupled between supply voltage Vcc 20 and the positive output side node (clk2p_Q) 64 of CML latch triggered inverted clock circuit 16.

CML latch triggered inverted clock circuit 16 further includes positive data input side sampling mode NMOS transistor 68, negative data input side sampling mode NMOS transistor 70, positive clock input switch NMOS transistor 76, and tail current NMOS transistor 88. Sampling mode NMOS transistor 68 has a positive data input 72 which represents the positive data input node connection of CML latch 16. Positive data input 72 is coupled to positive output side node (clk2p_I) 94 of CML latch 18. NMOS transistor 68 further has its source/drain terminals coupled between the negative output side node (clk2n_Q) 66 of CML latch 16 and NMOS transistor 76.

Sampling mode NMOS transistor 70 has a negative data input 74 which represents the negative data input node connection of CML latch 16. Negative data input 74 is coupled to negative output side node (clk2n_I) 96 of CML latch 18. NMOS transistor 70 further has its source/drain terminals coupled between the positive output side node (clk2p_Q) 64 of CML latch 16 and NMOS transistor 76. NMOS transistor 76 is configured as a switch to control a positive clock input of the CML latch stage 16, wherein its input 78 is coupled to the negative output (clkn) 46 of CML clock buffer 14, and further having its source/drain terminals coupled between (i) a common connection of source/drain terminals of NMOS transistors 68 and 70 and (ii) NMOS transistor 88, as discussed further herein below. Gate connection 78 (clkn) of NMOS transistor 76 is inverted from the buffered high speed clock input, and controls the switching for the positive clock input of CML latch stage 16.

CML latch triggered inverted clock circuit 16 further includes positive data output side latching mode NMOS transistor 80, negative data output side latching mode NMOS transistor 82, and negative clock input switch NMOS transistor 84. Latching mode NMOS transistor 80 has its input coupled to the positive data output (clk2p_Q) 64 of CML latch stage 16, and further having its source/drain terminals coupled between the negative data output side node (clk2n_Q) 66 of CML latch stage 16 and NMOS transistor 84.

Latching mode NMOS transistor 82 has its input coupled to a negative data output side node (clk2n_Q) 66 of CML latch stage 16, and further having its source/drain terminals coupled between the positive output side node (clk2p_Q) 64 of CML latch stage 16 and NMOS transistor 84. NMOS transistor 84 is configured as a switch to control a negative clock input of the CML latch stage 16, wherein its input 86 is coupled to the positive output (clkp) 44 of CML clock buffer 14, and further having its source/drain terminals coupled between (i) a common connection of source/drain terminals of NMOS transistors 80 and 82 and (ii) NMOS transistor 88, as discussed further herein below. Gate connection 86 (clkp) of NMOS transistor 84 is inverted from the buffered high speed clock input, and controls the switching for the negative clock input of CML latch stage 16.

NMOS transistor 88 is configured to control a tail current of the CML latch stage 16, wherein its input is coupled to the output node 30 of amplifier 24, and further having its source/drain terminals coupled between (i) a common connection of source/drain terminals of NMOS transistors 76 and 84 and (ii) ground voltage Vss 22.

CML latch triggered non-inverted full rate high speed clock circuit portion 18 includes positive and negative input sides and positive and negative output sides. For example, CML latch triggered non-inverted full rate high speed clock circuit portion 18 includes negative output side CML load resistor 90 and positive output side CML load resistor 92. CML load resistor 90 is coupled between supply voltage Vcc 20 and the negative output side node (clk2n_I) 96 of latch triggered non-inverted clock circuit 18. CML load resistor 92 is coupled between supply voltage Vcc 20 and the positive output side node (clk2p_I) 94 of CML latch triggered non-inverted clock circuit 18.

CML latch triggered non-inverted clock circuit 18 further includes positive data input side sampling mode NMOS transistor 98, negative date input side sampling mode NMOS transistor 100, positive clock input switch NMOS transistor 106, and tail current NMOS transistor 118. Sampling mode NMOS transistor 98 has a positive data input 102 which represents the positive data input node connection of CML latch 18. Positive data input 102 is inverted from CML latch 16 data output, and more particularly, is coupled to negative output side node (clk2n_Q) 66 of CML latch 16. NMOS transistor 98 further has its source/drain terminals coupled between the negative output side node (clk2n_I) 96 of CML latch 18 and NMOS transistor 106.

Sampling mode NMOS transistor 100 has a negative data input 104 which represents the negative data input node connection of CML latch 18. Negative data input 104 is inverted from CML latch 16 data output, and more particularly, is coupled to positive output side node (clk2p_Q) 64 of CML latch 16. NMOS transistor 100 further has its source/drain terminals coupled between the positive output side node (clk2p_I) 94 of CML latch 18 and NMOS transistor 106. NMOS transistor 106 is configured as a switch to control a positive clock input of the CML latch stage 18, wherein its input 108 is coupled to the positive output (clkp) 44 of CML clock buffer 14, and further having its source/drain terminals coupled between (i) a common connection of source/drain terminals of NMOS transistors 98 and 100 and (ii) NMOS transistor 118, as discussed further herein below. Gate connection 108 (clkp) of NMOS transistor 106 is non-inverted from the buffered high speed clock input, and controls the switching for the positive clock input of CML latch stage 18.

CML latch triggered non-inverted clock circuit 18 further includes positive data output side latching mode NMOS transistor 110, negative date output side latching mode NMOS transistor 112, and negative clock input switch NMOS transistor 114. Latching mode NMOS transistor 110 has its input coupled to the positive data output (clk2p_I) 94 of CML latch stage 18, and further having its source/drain terminals coupled between the negative data output side node (clk2n_I) 96 of CML latch stage 18 and NMOS transistor 114.

Latching mode NMOS transistor 112 has its input coupled to a negative data output side node (clk2n_I) 96 of CML latch stage 18, and further having its source/drain terminals coupled between the positive output side node (clk2p_I) 94 of CML latch stage 18 and NMOS transistor 114. NMOS transistor 114 is configured as a switch to control a negative clock input of the CML latch stage 18, wherein its input 116 is coupled to the negative output (clkn) 46 of CML clock buffer 14, and further having its source/drain terminals coupled between (i) a common connection of source/drain terminals of NMOS transistors 110 and 112 and (ii) NMOS transistor 118, as discussed further herein below. Gate connection 116 (clkn) of NMOS transistor 114 is non-inverted from the buffered high speed clock input, and controls the switching for the negative clock input of CML latch stage 18.

NMOS transistor 118 is configured to control a tail current of the CML latch stage 18, wherein its input is coupled to the output node 30 of amplifier 24, and further having its source/drain terminals coupled between (i) a common connection of source/drain terminals of NMOS transistors 106 and 114 and (ii) ground voltage Vss 22.

Figure 2:
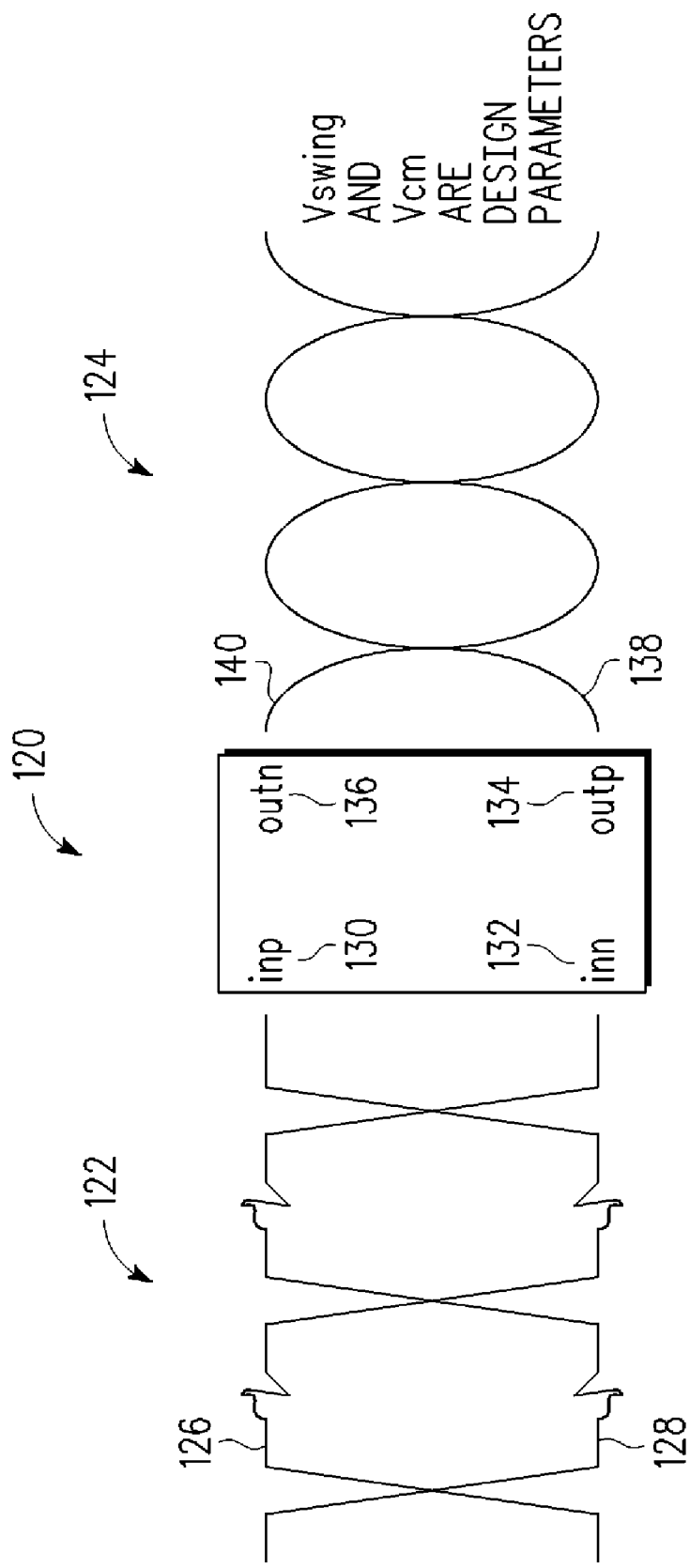
FIG. 2 is a functional block diagram view of a square wave clock to pseudo-sinusoidal wave clock conversion according to the embodiments of the present disclosure.

FIG. 2 is a functional block diagram view of a square wave clock to pseudo-sinusoidal wave clock conversion according to the embodiments of the present disclosure. Input clock 122 comprises a CMOS complementary or CML differential clock, which contains typical switching noises or glitches in the waveform due to upstream clock divider or noise coupling from a corresponding clock distribution network. Output 124 comprises a pseudo-sinusoidal wave clock in differential mode, and more particularly, a nearly sinusoidal waveform clock. To be nearly sinusoidal, the output waveform is characterized by a very low edge rate, wherein nearly half a clock period is consumed slewing up and half slewing down. In addition, clock waveform pull-up and pull-down are substantially symmetrical, and switching noises or glitches substantially being removed.

As mentioned above, input clock 122 of the square to pseudo-sinusoidal converter 120 comprises a CMOS complementary or CML differential clock. Contained within the input clock signal are typical switching noises or glitches in the waveform due to upstream clock divider or noise coupling from a corresponding clock distribution network. The positive half of input clock 122 in complementary or differential mode is generally indicated by reference numeral 126. Similarly, the negative half of the input clock 122 in complementary or differential mode is generally indicated by reference numeral 128. Square-to-pseudo-sinusoidal converter 120 includes a positive input node (inp) which is generally indicated by reference numeral 130 and a negative input node (inn) which is generally indicated by reference numeral 132. Square-to-pseudo-sinusoidal converter 120 further includes a positive output node (outp) which is generally indicated by reference numeral 134 and a negative output node (outn) which is generally indicated by reference numeral 136. Output clock 124 is pseudo-sinusoidal wave clock in differential mode, as occurring on positive and negative output nodes, 134 and 136, respectively.

According to one embodiment, the output clock 124 waveform is expected to have very low edge rate, nearly half clock period doing slewing up and half doing slewing down, and further wherein the output waveform pull-up and pull-down is expected to symmetrical and glitch-free to substantially mimic a sinusoidal wave clock in differential mode. The positive half of the output clock in differential mode is generally indicated by reference numeral 138. With respect to the positive half 138 of the output clock, output swing and common mode voltage of the output are flexible design parameters, wherein an important characteristic of the output is that the output is characterized as pseudo-sinusoidal wave like with controlled slew-rate and pull-up and pull-down symmetry. The negative half of the output clock in differential mode is generally indicated by reference numeral 140. With respect to the negative half 140 of the output clock, output swing and common mode voltage of the output are flexible design parameters, wherein an important characteristic of the output is that the output is characterized as pseudo-sinusoidal wave like with controlled slew-rate and pull-up and pull-down symmetry.

Figure 3:
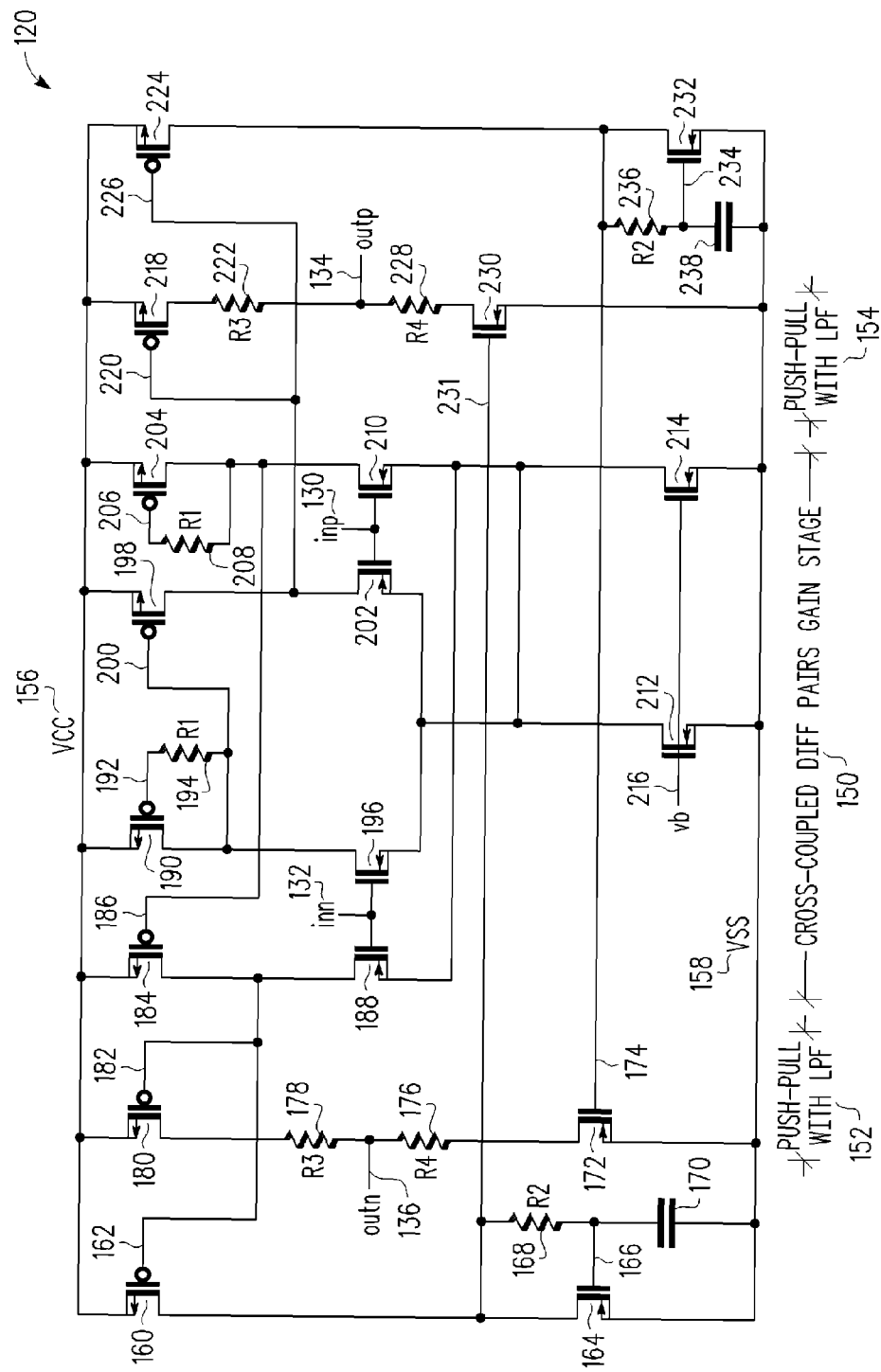
FIG. 3 is an illustrative circuit schematic view of a slew-rate controlled clock buffer circuit for square to pseudo-sinusoidal conversion according to one embodiment of the present disclosure.

FIG. 3 is an illustrative circuit schematic view of a slew-rate controlled clock buffer or converter circuit 120 for square to pseudo-sinusoidal conversion according to one embodiment of the present disclosure. In connection with the illustration of FIG. 2, the input I and Q clocks after CML divide-by-2 are square wave like clocks 122 (FIG. 2) and have undesirable strong edge rate and full-rate clock feed-through. FIG. 3 shows the slew rate controlled buffer paired after divide-by-2 and in front of a phase interpolator circuit (not shown) to perform square to pseudo-sinusoidal conversion. The buffer 120 comprises a cross-coupled input gain stage, which quickly saturates a CML swing to large differential swing and removes clock glitches introduced from the divide-by-2 circuit. The second stage is a push-pull driving stage combined with level shifting and low pass filtering. The push-pull ensures symmetrical pull-up and pull-down. In addition, push-pull combined with RC low pass filter has been found to advantageously and substantially mimic a sinusoidal waveform. Resistors R3 and R4 are configured to adjust output common mode voltage and attenuate output edge rate together with capacitive loads, or alternatively referred to as $C_{load}$'s. $C_{load}$'s are capacitive loads connected at the square to pseudo-sinusoidal converter outputs. Resistors R1 and R2 are configured to provide for active inductive peaking to boost this amplifier type buffer for multi-GHz bandwidth. Circuit 120 is further explained in the following.

According to one embodiment, square wave clock to pseudo-sinusoidal wave clock conversion circuit 120 comprises two stages. In a first stage (Stage 1), a cross-coupled differential pair gain stage 150 is configured for providing the following functions: 1) quickly saturates weak input clock to large swing, 2) performs buffering and removal of high frequency glitches, and 3) performs a first attempt to create balance/symmetrical pull-up and pull-down in the differential clock signal. In a second stage (Stage 2), comprising each of two push-pull driving stages combined with RC low pass filters, generally indicated by reference numerals 152 and 154, are configured for providing the following functions: 1) push-pull strongly balance/symmetrical pull-up and pull-down, and 2) responsive to a symmetrical waveform being attenuated by low pass filter in the push-pull process, the final output comprises a nearly sinusoidal output. Additionally, the circuit further comprises active inductive peaking configured to make the amplifier type buffer comparable to CML in speed for power and area efficiency.

In FIG. 3, square to pseudo-sinusoidal converter 120 includes a positive input node 130, a negative input node 132, a positive output node 134, and a negative output node 136, as previously discussed in connection with FIG. 2. In FIG. 3, the first stage (Stage 1), generally indicated by reference numeral 150, comprises a cross-coupled differential pair gain stage of the square to pseudo-sinusoidal converter 120. Briefly mentioned herein above, Stage 1 is configured for providing the following functions: 1) quickly saturates weak input clock to large swing, 2) performs clock buffering and removal of high frequency glitches, and 3) acts as the first attempt to create a balance/symmetrical pull-up and pull-down. Stage 2 at the negative output side, generally indicated by reference numeral 152, comprises a push-pull driving stage combined with RC low pass filter, of the square to pseudo-sinusoidal converter 120. On the negative output side 152, Stage 2 is configured for providing the following functions: 1) push-pull strongly balance/symmetrical pull-up and pull-down, and 2) responsive to symmetrical waveform being attenuated by low pass filter in the push-pull process, final output comprises a nearly sinusoidal output. In addition, Stage 2 at the positive output side, generally indicated by reference numeral 154, comprises a push-pull driving stage combined with RC low pass filter, of the square to pseudo-sinusoidal converter 120. On the positive output side 154, Stage 2 is configured for providing the following functions: 1) push-pull strongly balance/symmetrical pull-up and pull-down, and 2) responsive to symmetrical waveform being attenuated by low pass filter in the push-pull process, final output comprises a nearly sinusoidal output. Circuit portions 150, 152, and 154 are each coupled between supply voltage (Vcc) node 156 and ground voltage (Vss) node 158.

As discussed herein with respect to the embodiments of the present disclosure, an ideal circuit model was used to prove the concept that push-pull combined with low pass filter (LP) excellently mimic a sinusoidal wave clock generator. Similarly as shown in FIG. 3, a resistor (R3) coupled between voltage supply Vcc and a capacitive load ($C_{load}$) (corresponding to current push (Ipush)) or a resistor (R4) is coupled between a capacitive load ($C_{load}$) and ground supply Vss (corresponding to current pull (Ipull)) forms the low pass filter, push-pull circuit having the sum of pushing current and pulling current constant. In other words, Ipush+Ipull=Constant. Generally in a push-pull circuit, the gate voltages of both PMOS and NMOS transistors at the output driver are moving together, therefore a triangle current waveform can be used to mimic the current behavior during the push-pull process. A simulation using the above-mentioned configuration resulted in an ideal push-pull combined with LP voltage waveform closely mimicking a sinusoidal waveform generator output voltage waveform. The ideal push-pull combined with LP voltage waveform is characterized by very slow slew-rate and waveform pull-up and pull-down symmetry, which can be treated as a pseudo-sinusoidal waveform.

Referring still to the circuit 120 of FIG. 3, PMOS transistor 160 is controlled by Stage 1 output positive node 162 to generate the floating bias at 231 for Stage 2 final output (outp) 134 positive side 154. NMOS transistor 164 is configured in a diode-connected configuration with resistor (R2) 168 adapted for inductive peaking of the output 231 of PMOS transistor 160, and further adapted to generate a corresponding bias voltage as a pulling current control of Stage 2 final output positive side 154. NMOS transistor 164 includes a biasing circuit controlled by a gate voltage 166 and gate voltage stabilizing capacitor 170. In addition, resistor (R2) 168 is coupled in series within the diode-connected configuration of NMOS transistor 164 for active inductive peaking for narrow frequency range and to boost the floating bias stage bandwidth.

NMOS transistor 172 is configured for pulling current of the push-pull circuit for Stage 2 final output (outn) 136 negative side 152. NMOS transistor 172 is controlled by pulling current control 174 for Stage 2 final output (outn) 136 negative side 152, which comes from floating bias circuits 224 and 232, which are the counterpart of floating bias circuits 160 and 164. Resistor (R4), indicated by reference numeral 176, comprises a resistor of a low pass filter in Stage 2 final output stage negative side 152, in the pulling path. Capacitor of the low pass (LP) is implicit, which comprises a capacitive load from a circuit (not shown) connected at the output node (outn) 136 of the Stage 2 final output stage negative side 152. Resistor (R3), indicated by reference numeral 178, comprises a resistor of the low pass filter in Stage 2 final output stage negative side 152, in the pushing path. Again, the capacitor of LP is implicit, which is the capacitive load from a circuit (not shown) connected at the output node (outn) 136 of the Stage 2 final output stage negative side 152. PMOS transistor 180 is configured for pushing current of the push-pull circuit for Stage 2 final output negative side 152. PMOS transistor 180 is controlled via gate 182, wherein gate 182 is coupled to Stage 1 output positive node 162 to control the Stage 2 pushing path.

PMOS transistor 184 is configured as an active load for cross-coupled differential pairs of input gain stage 150, wherein PMOS transistor 184 is on the Stage 1 output positive side. PMOS transistor 184 is controlled via gate 186. Gate 186 is configured to provide a bias voltage for the active load 184, which comes from diode connected transistor 204 doing current mirroring and acting as an active load for outer differential pair NMOS transistors 188 and 210. NMOS transistor 188 is configured as a negative input side NMOS transistor of outer differential pair NMOS transistors 188 and 210, which is cross-coupled with inner differential pair NMOS transistors 196 and 202.

PMOS transistor 190 is configured as a diode connected PMOS transistor with resistor (R1) 194 within the series of connection as inductive peaking, acting as active load for inner differential pair NMOS transistors 196 and 202 and current mirror for PMOS transistor 198. PMOS transistor 190 includes a diode-connected biasing circuit controlled by a gate voltage at gate 192. In addition, resistor (R1) 194 is coupled in series within the diode-connected configuration of PMOS transistor 190 for active inductive peaking for narrow frequency range to boost the active load bias stage bandwidth. Furthermore, NMOS transistor 196 is configured as the negative input side NMOS transistor of inner differential pair of NMOS transistors 196 and 202, which is cross-coupled with outer differential pair of NMOS transistors 188 and 210.

PMOS transistor 198 is configured as an active load for cross-coupled differential pairs of input gain stage 150, wherein PMOS transistor 198 is on Stage 1 output negative side. PMOS transistor 198 is controlled by a bias voltage for the active load 198 on its gate 200, wherein the bias voltage comes from the diode-connected PMOS transistor 190 doing current mirroring and acting as an active load for inner differential pair of NMOS transistors 196 and 202. NMOS transistor 202 is configured as the positive input side NMOS transistor of inner differential pair of NMOS transistors 196 and 202, which is cross-coupled with outer differential pair of NMOS transistors 188 and 210.

PMOS transistor 204 comprises a diode connected PMOS transistor with resistor (R1) 208 within the series of connection as inductive peaking, acting as an active load for the outer differential pair of NMOS transistors 188 and 210 and current mirror for PMOS transistor 184. PMOS transistor 204 includes a diode-connected biasing circuit controlled by a gate voltage at gate 206. In addition, resistor (R1) 208 is coupled in series within the diode-connected configuration of PMOS transistor 204 for active inductive peaking for narrow frequency range to boost the active load bias stage bandwidth. Furthermore, NMOS transistor 210 is configured as the positive input side NMOS transistor of outer differential pair of NMOS transistors 188 and 210, which is cross-coupled with inner differential pair of NMOS transistors 196 and 202.

NMOS transistor 212 is configured as a first tail current branch (Branch 1) for the cross-coupled differential pairs of inner and outer NMOS transistors (196,202) and (188,210), respectively, of gain stage 150. NMOS transistor 214 is configured as a second tail current branch (Branch 2) for the cross-coupled differential pairs of inner and outer NMOS transistors (196,202) and (188,210), respectively, of gain stage 150. NMOS transistors 212 and 214 are controlled via their respective bases being coupled to an external bias voltage (Vb) 216 for NMOS tail currents for cross-coupled differential pairs gain stage 150.

Referring still to the circuit 120 of FIG. 3, PMOS transistor 218 is configured for pushing current of the push-pull circuit of Stage 2 final output positive side 154. PMOS transistor 218 is controlled via gate 220, wherein gate 220 is coupled to Stage 1 output negative node to control the Stage 2 pushing path. Resistor (R3), indicated by reference numeral 222, comprises a resistor of the low pass filter in Stage 2 final output stage positive side 154, in the pushing path. Again, the capacitor of LP is implicit, which is the capacitive load from a circuit (not shown) connected at the output node (outp) 134 of the Stage 2 final output stage positive side 154.

PMOS transistor 224 is controlled by Stage 1 output negative node 226 to generate the floating bias at 174 for Stage 2 final output (outn) 136 negative side 152. Resistor (R4), indicated by reference numeral 228, comprises a resistor of a low pass filter in Stage 2 final output stage positive side 154, in the pulling path. The capacitor of the low pass (LP) is implicit, which comprises a capacitive load from a circuit (not shown) connected at the output node (outp) 134 of the Stage 2 final output stage positive side 154.

NMOS transistor 230 is configured for pulling current of the push-pull circuit for Stage 2 final output (outp) 134 positive side 154. NMOS transistor 230 is controlled by pulling current control 231 for Stage 2 final output (outp) 134 positive side 154, which comes from floating bias circuits 160 and 164, which are the counterpart of floating bias circuits 224 and 232. NMOS transistor 232 is configured in a diode-connected configuration with resistor (R2) 236 adapted for inductive peaking of the output 174 of PMOS transistor 224, and further adapted to generate a corresponding bias voltage as a pulling current control of Stage 2 final output negative side 152. NMOS transistor 232 includes a biasing circuit controlled by a gate voltage 234 and gate voltage stabilizing capacitor 238. In addition, resistor (R2) 236 is coupled in series within the diode-connected configuration of NMOS transistor 232 for active inductive peaking for narrow frequency range and to boost the floating bias stage bandwidth.

Figure 4:
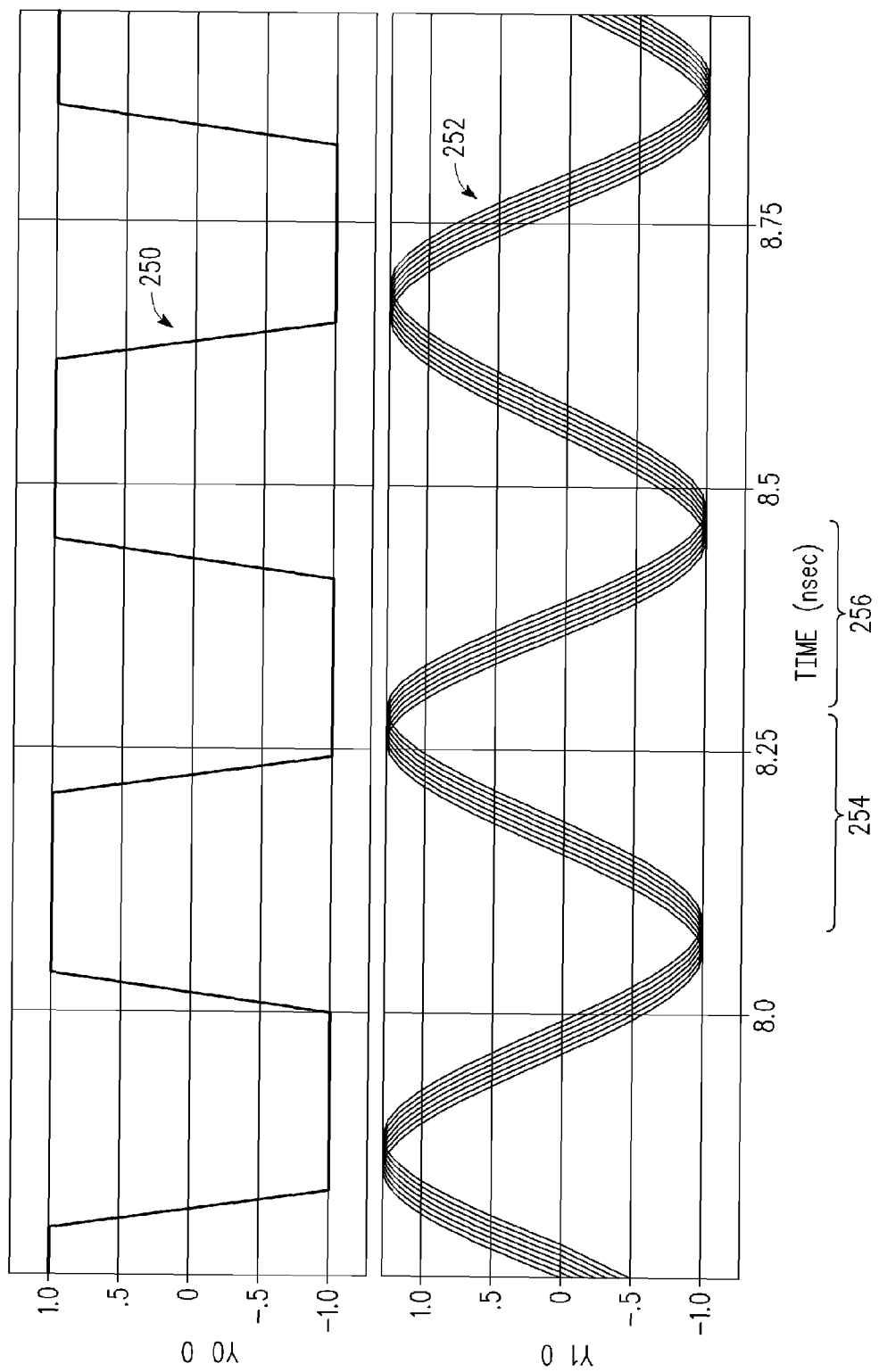
FIG. 4 is a waveform diagram view of one example of seventeen (17) normalized square wave clock inputs and 17 normalized pseudo-sinusoidal wave clock outputs across 17 PVT's (i.e., process, voltage, temperature) combinations for a slew-rate controlled clock buffer circuit according to the embodiments of the present disclosure.

FIG. 4 is a waveform diagram view of one example of seventeen (17) normalized square wave clock inputs and 17 normalized pseudo-sinusoidal wave clock outputs across 17 PVT's (i.e., process, voltage, temperature) combinations for a slew-rate controlled clock buffer circuit according to the embodiments of the present disclosure.

In FIG. 4, waveform 250 is representative of a waveform diagram view of seventeen (17) normalized square wave clock inputs across 17 PVT's (i.e., process, voltage, temperature) combinations for a slew-rate controlled clock buffer circuit for square to pseudo-sinusoidal conversion. 17 input clocks start from same initial phase as square clocks, for example, comprising 0.4*Vcc CML swing differential clocks. Although the supply voltage Vcc may change +/−10%, all 17 input clocks completely overlay on each other after amplitude normalization.

Waveform 252 is representative of a waveform diagram view of seventeen (17) normalized pseudo-sinusoidal wave clock outputs across 17 PVT's (i.e., process, voltage, temperature) combinations from the slew-rate controlled clock buffer circuit output for square to pseudo-sinusoidal conversion according to the embodiments of the present disclosure. Each of 17 outputs is normalized to its maximum output swing voltage, as the output swing and common mode voltage are flexible design parameters. The most important is slew rate and clock waveform pull-up and pull-down symmetry. Different PVT conditions have different impacts on outputto-input clock delay, for example, the slower process, the lower voltage and the higher temperature, the longer the delay. However, the PVT conditions have negligible impacts on the square to pseudo-sinusoidal conversion efficiency of the converter circuit 120 according to the embodiments of the present disclosure. All normalized output clocks have very low slew rate, nearly half a clock period for performing the slewing up and half a clock period for performing the slewing down. In addition, it is noted that all output clock waveforms have excellent pull-up and pull-down symmetry. Accordingly, the output clocks closely mimic sinusoidal clock waveforms across PVT's.

With reference still to FIG. 4, the portion of the waveforms indicated by reference numeral 254 is representative of pseudo-sinusoidal clock waveforms from 120 outputs in the pull-up region. The slew rate of pulling-up is low and close to the case of sinusoidal clock waveform, that is, nearly all half period of the clock is doing slewing-up. Clock edges from the 120 outputs are close to the shape of a sinusoidal clock, with excellent pull-up and pull-down symmetry. In addition, the portion of the waveforms indicated by reference numeral 256 is representative of pseudo-sinusoidal clock waveforms from 120 outputs in the pull-down region. The slew rate of pulling-down is low and close to the case of sinusoidal clock waveform, that is, nearly all half period of the clock is doing slewing-down. Clock edges from 120 outputs are close to the shape of sinusoidal clock, with excellent pull-up and pull-down symmetry.

As used herein, the terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Each signal described herein may be designed as positive or negative logic, where negative logic can be indicated by a bar over the signal name or an asterix (*) following the name. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

By now it should be appreciated that there has been provided a square wave to pseudo-sinusoidal clock conversion circuit comprising: a first stage, wherein the first stage comprises a cross-coupled differential pairs input gain stage and includes a positive input side and a negative input side, the first stage being configured to receive a differential square wave clock input across the positive input side and the negative input side, wherein responsive to the differential square wave clock input, the first stage is configured to provide a first pass attempt to create a balanced differential clock with pull-up and pull-down symmetry; and a second stage, wherein the second stage comprises a positive output side push-pull with low pass filter circuit and a negative output side push-pull with low pass filter circuit, wherein the positive and negative output side push-pull with low pass filter circuits are responsive to the first pass attempt balanced differential clock from the first stage for producing an output pseudo-sinusoidal clock that comprises a nearly sinusoidal output with slew rate and clock waveform pull-up and pull-down symmetry for each of a respective one of the positive and negative output sides.

In one embodiment of the circuit, the differential square wave clock input comprises a weak clock input, and wherein the first stage is further configured to saturate the weak differential square wave clock input to a large swing. In addition, the first stage is further configured to perform input clock buffering and removal of high frequency glitches from the input clock.

In another embodiment of the circuit, each output side push-pull with low pass filter circuit of the second stage is configured to (i) provide a push-pull strongly balanced pull-up and pull-down symmetrical waveform, and (ii) attenuate the symmetrical waveform by a low pass filtering in a push-pull process of the push-pull with low pass filter circuit to produce the output pseudo-sinusoidal clock that comprises a nearly sinusoidal output with slew rate controlled and clock waveform pull-up and pull-down symmetry for each of a respective one of the positive and negative output sides.

In another embodiment, the circuit further comprises: a positive output side floating bias circuit, wherein the positive output side floating bias circuit is configured to provide a floating bias to the negative output side push-pull with low pass filter circuit of the second stage; and a negative output side floating bias circuit, wherein the negative output side floating bias circuit is configured to provide a floating bias to the positive output side push-pull with low pass filter circuit of the second stage. In addition, the first and second stages together include resistors configured to provide for active inductive peaking to boost an amplification and buffering of the square wave to pseudo-sinusoidal clock conversion circuit for multi-GHz bandwidth performance.

In a further embodiment, the cross-coupled differential pairs input gain stage further comprises: a first PMOS transistor 184 configured on an output positive side of the first stage as an active load for the cross-coupled differential pairs input gain stage, the first PMOS transistor 184 being controlled via a gate bias voltage for the active load which comes from a first diode-connected PMOS transistor 204 doing current mirroring and acting as an active load for an outer differential pair of first and second NMOS transistors 188 and 210, the first NMOS transistor 188 configured as a negative input side NMOS transistor of outer differential pair of first and second NMOS transistors 188 and 210, which is cross-coupled with an inner differential pair of third and fourth NMOS transistors 196 and 202.

The cross-coupled differential pairs gain stage further comprises: a PMOS transistor 190 configured as a second diode-connected PMOS transistor with a first resistor (R1) 194 coupled in series within the second diode-connected configuration for active inductive peaking for narrow frequency range to boost an active load bias stage bandwidth, the second diode-connected PMOS transistor acting as an active load for the inner differential pair of third and fourth NMOS transistors 196 and 202 and as a current mirror for a second PMOS transistor 198, the third NMOS transistor 196 being configured as a negative input side NMOS transistor of inner differential pair of third and fourth NMOS transistors 196 and 202 which is cross-coupled with outer differential pair of first and second NMOS transistors 188 and 210.

The cross-coupled differential pairs input gain stage further comprises: a third PMOS transistor 198 configured on an output negative side of the first stage as an active load for the cross-coupled differential pairs input gain stage, the third PMOS transistor 198 being controlled via a gate bias voltage for the active load which comes from the second diode-connected PMOS transistor 190 doing current mirroring and acting as an active load for the inner differential pair of the third and fourth NMOS transistors 196 and 202, the fourth NMOS transistor 202 being configured as the positive input side NMOS transistor of inner differential pair of third and fourth NMOS transistors 196 and 202, which is cross-coupled with outer differential pair of first and second NMOS transistors 188 and 210.

The cross-coupled differential pairs input gain stage further comprises: a PMOS transistor 204 configured as the first diode-connected PMOS transistor with a second resistor (R1) 208 within the first diode-connected configuration for active inductive peaking for narrow frequency range to boost an active load bias stage bandwidth, the first diode-connected PMOS transistor acting as an active load for the outer differential pair of first and second NMOS transistors 188 and 210 and as a current mirror for the first PMOS transistor 184, the second NMOS transistor 210 being configured as a positive input side NMOS transistor of outer differential pair of first and second NMOS transistors 188 and 210, which is cross-coupled with inner differential pair of third and fourth NMOS transistors 196 and 202.

Still further, the cross-coupled differential pairs input gain stage further comprises: a fifth NMOS transistor 212 configured as a first tail current branch (Branch 1) for the cross-coupled differential pairs of inner and outer NMOS transistors (196,202) and (188,210), respectively, of the input gain stage; and a sixth NMOS transistor 214 configured as a second tail current branch (Branch 2) for the cross-coupled differential pairs of inner and outer NMOS transistors (196,202) and (188,210), respectively, of the input gain stage, wherein the fifth and sixth NMOS transistors are controlled via their respective bases being coupled to an external bias voltage (Vb) for NMOS tail currents of the input gain stage.

In another embodiment, the positive output side push-pull with low pass filter circuit of the second stage comprises: a third resistor (R3) coupled between a voltage supply (Vcc) and a capacitive load (Cload) configured to provide a current corresponding to a current push (Ipush); and a fourth resistor (R4) is coupled between a capacitive load (Cload) and ground supply (Vss) configured to provide a current pull (Ipull)), further forming a low pass filter of the positive output side push-pull with low pass filter circuit, the positive output side push-pull with low pass filter circuit further being configured to have the sum of pushing current and pulling current constant (Ipush+Ipull=Constant). The first and second stages together are configured to provide for active inductive peaking to boost an amplification and buffering of the square wave to pseudo-sinusoidal clock conversion circuit for multi-GHz bandwidth performance.

In yet another embodiment, the negative output side push-pull with low pass filter circuit of the second stage comprises: a third resistor (R3) coupled between a voltage supply (Vcc) and a capacitive load (Cload) configured to provide a current corresponding to a current push (Ipush); and a fourth resistor (R4) is coupled between a capacitive load (Cload) and ground supply (Vss) configured to provide a current pull (Ipull)), further forming a low pass filter of the positive output side push-pull with low pass filter circuit, the positive output side push-pull with low pass filter circuit further being configured to have the sum of pushing current and pulling current constant (Ipush+Ipull=Constant). The first and second stages together are configured to provide for active inductive peaking to boost an amplification and buffering of the square wave to pseudo-sinusoidal clock conversion circuit for multi-GHz bandwidth performance.

In another embodiment, a square wave to pseudo-sinusoidal clock conversion circuit comprises: a first stage, wherein the first stage comprises a cross-coupled differential pairs input gain stage and includes a positive input side and a negative input side, the first stage being configured to receive a differential square wave clock input across the positive input side and the negative input side, wherein responsive to the differential square wave clock input, the first stage is configured to (i) saturate a weak differential square wave clock input to a large swing, (ii) perform input clock buffering and removal of high frequency glitches from the input clock, and (iii) provide a first pass attempt to create a balanced differential clock with pull-up and pull-down symmetry; and a second stage, wherein the second stage comprises a positive output side push-pull with low pass filter circuit and a negative output side push-pull with low pass filter circuit, wherein the positive and negative output side push-pull with low pass filter circuits are responsive to the first pass attempt balanced differential clock from the first stage for producing an output pseudo-sinusoidal clock that comprises a nearly sinusoidal output with slew rate and clock waveform pull-up and pull-down symmetry for each of a respective one of the positive and negative output sides, wherein each output side push-pull with low pass filter circuit of the second stage is configured to (i) provide a push-pull strongly balanced pull-up and pull-down symmetrical waveform, and (ii) attenuate the symmetrical waveform by a low pass filtering in a push-pull process of the push-pull with low pass filter circuit to produce the output pseudo-sinusoidal clock that comprises a nearly sinusoidal output with slew rate controlled and clock waveform pull-up and pull-down symmetry for each of a respective one of the positive and negative output sides.

In yet another embodiment, the circuit further comprises: a positive output side floating bias circuit, wherein the positive output side floating bias circuit is configured to provide a floating bias to the positive output side push-pull with low pass filter circuit of the second stage; and a negative output side floating bias circuit, wherein the negative output side floating bias circuit is configured to provide a floating bias to the negative output side push-pull with low pass filter circuit of the second stage. In a still further embodiment, the first and second stages together include resistors configured to provide for active inductive peaking to boost an amplification and buffering of the square wave to pseudo-sinusoidal clock conversion circuit for multi-GHz bandwidth performance.

According to another embodiment, a method of implementing square wave to pseudo-sinusoidal clock conversion comprises: providing a first stage, wherein the first stage comprises a cross-coupled differential pairs input gain stage and includes a positive input side and a negative input side, the first stage being configured to receive a differential square wave clock input across the positive input side and the negative input side, wherein responsive to the differential square wave clock input, the first stage is configured to provide a first pass attempt to create a balanced differential clock with pull-up and pull-down symmetry; and providing a second stage, wherein the second stage comprises a positive output side push-pull with low pass filter circuit and a negative output side push-pull with low pass filter circuit, wherein the positive and negative output side push-pull with low pass filter circuits are responsive to the first pass attempt balanced differential clock from the first stage for producing an output pseudo-sinusoidal clock that comprises a nearly sinusoidal output with slew rate controlled and clock waveform pull-up and pull-down symmetry for each of a respective one of the positive and negative output sides. In another embodiment, the method further comprises: providing a positive output side floating bias circuit, wherein the positive output side floating bias circuit is configured to provide a floating bias to the positive output side push-pull with low pass filter circuit of the second stage; and providing a negative output side floating bias circuit, wherein the negative output side floating bias circuit is configured to provide a floating bias to the negative output side push-pull with low pass filter circuit of the second stage, wherein the first and second stages together include resistors configured to provide for active inductive peaking to boost an amplification and buffering of the square wave to pseudo-sinusoidal clock conversion circuit for multi-GHz bandwidth performance.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed.

Thus, it is to be understood that the architectures depicted herein are merely exemplary, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

In addition, those skilled in the art will recognize that boundaries between the functionality of the above described operations merely illustrative. The functionality of multiple operations may be combined into a single operation, and/or the functionality of a single operation may be distributed in additional operations. Furthermore, alternative embodiments may include multiple instances of a particular operation, and the order of operations may be altered in various other embodiments.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A square wave to pseudo-sinusoidal clock conversion circuit comprising:
  a first stage, wherein the first stage comprises a cross-coupled differential pair input gain stage and includes a positive input side and a negative input side, the first stage being configured to receive a differential square wave clock input that is a weak clock input across the positive input side and the negative input side, wherein responsive to the differential square wave clock input, the first stage is configured to provide a first pass attempt to create a balanced differential clock with pull-up and pull-down symmetry, the first stage being configured to saturate the weak clock input to a large swing, the first stage further comprising a first transistor of a first conductivity type configured on an output positive side of the first stage as an active load for the cross-coupled differential pair input gain stage, the first transistor of first conductivity type being controlled via a gate bias voltage for the active load which comes from a first diode-connected transistor having the first conductivity type doing current mirroring and acting as an active load for an outer differential pair of first and second transistors of a second conductivity type, the first transistor of the second conductivity type configured as a negative input side second conductivity type transistor of the outer differential pair of first and second transistors of second conductivity type, which is cross-coupled with an inner differential pair of third and fourth transistors of second conductivity type;
  a second stage, wherein the second stage comprises a positive output side push-pull with low pass filter circuit and a negative output side push-pull with low pass filter circuit, wherein the positive and negative output side push-pull with low pass filter circuits are responsive to the first pass attempt balanced differential clock from the first stage for producing an output pseudo-sinusoidal clock that comprises a nearly sinusoidal output with slew rate and clock waveform pull-up and pull-down symmetry for each of a respective one of the positive and negative output sides;
  a positive output side floating bias circuit, wherein the positive output side floating bias circuit is configured to provide a floating bias to the negative output side push-pull with low pass filter circuit of the second stage; and
  a negative output side floating bias circuit, wherein the negative output side floating bias circuit is configured to provide a floating bias to the positive output side push-pull with low pass filter circuit of the second stage;
  wherein the first and second stages together include resistors configured to provide for active inductive peaking to boost an amplification and buffering of the square wave to pseudo-sinusoidal clock conversion circuit for multi-GHz bandwidth performance.

2. The circuit of claim 1, wherein the first stage is further configured to perform input clock buffering and removal of high frequency glitches from the input clock.

3. The circuit of claim 1, wherein each output side push-pull with low pass filter circuit of the second stage is configured to (i) provide a push-pull strongly balanced pull-up and pull-down symmetrical waveform, and (ii) attenuate the symmetrical waveform by a low pass filtering in a push-pull process of the push-pull with low pass filter circuit to produce the output pseudo-sinusoidal clock that comprises a nearly sinusoidal output with slew rate controlled and clock waveform pull-up and pull-down symmetry for each of a respective one of the positive and negative output sides.

4. The circuit of claim 1, wherein the differential pairs input gain stage further comprises:
   first conductivity is a P conductivity and the second conductivity is an N conductivity.

5. The circuit of claim 4, wherein the cross-coupled differential pair gain stage further comprises:
   a first PMOS transistor configured as a second diode-connected transistor with a first resistor coupled in series with the second diode-connected transistor for active inductive peaking for narrow frequency range to boost an active load bias stage bandwidth, the second diode-connected transistor acting as an active load for the inner differential pair of third and fourth transistors of second conductivity type and as a current mirror for a second PMOS transistor, the third transistor of second conductivity type being configured as a negative input side NMOS transistor of the inner differential pair of third and fourth transistors of second conductivity type which is cross-coupled with the outer differential pair of first and second transistors of second conductivity type.

6. The circuit of claim 5, wherein the cross-coupled differential pair input gain stage further comprises:
   a second PMOS transistor configured on an output negative side of the first stage as an active load for the cross-coupled differential pair input gain stage, the second PMOS transistor being controlled via a gate bias voltage for the active load which comes from the second diode-connected transistor doing current mirroring and acting as an active load for the inner differential pair of the third and fourth transistors of second conductivity type, the fourth transistor of second conductivity type being configured as the positive input side transistor of the inner differential pair of third and fourth transistors of second conductivity type, which is cross-coupled with the outer differential pair of first and second transistors of second conductivity type.

7. The circuit of claim 6, wherein the cross-coupled differential pair input gain stage further comprises:
   a third PMOS transistor configured as the first diode-connected transistor of first conductivity type with a second resistor within the first diode-connected configuration for active inductive peaking for narrow frequency range to boost an active load bias stage bandwidth, the first diode-connected PMOS transistor acting as an active load for the outer differential pair of first and second NMOS transistors and as a current mirror for the first PMOS transistor, the second NMOS transistor being configured as a positive input side NMOS transistor of outer differential pair of first and second NMOS transistors, which is cross-coupled with inner differential pair of third and fourth NMOS transistors.

8. The circuit of claim 7, wherein the cross-coupled differential pair input gain stage further comprises:
   a fifth NMOS transistor configured as a first tail current branch (Branch 1) for the inner and outer differential pair of transistors respectively, of the input gain stage; and
   a sixth NMOS transistor configured as a second tail current branch (Branch 2) for the inner and outer differential pair of transistors, respectively, of the input gain stage, wherein the fifth and sixth NMOS transistors are controlled via their respective bases being coupled to an external bias voltage (Vb) for NMOS tail currents of the input gain stage.

9. The circuit of claim 7, wherein the positive output side push-pull with low pass filter circuit of the second stage comprises:
   a third resistor coupled between a voltage supply (Vcc) and a capacitive load (Cload) configured to provide a current corresponding to a current push (Ipush); and
   a fourth resistor is coupled between the capacitive load (Cload) and ground supply (Vss) configured to provide a current pull (Ipull), further forming a low pass filter of the positive output side push-pull with low pass filter circuit, the positive output side push-pull with low pass filter circuit further being configured to have a sum of pushing current and pulling current equal a constant value (Ipush+Ipull=Constant).

10. The circuit of claim 1, wherein the negative output side push-pull with low pass filter circuit of the second stage comprises:
    a first resistor coupled between a voltage supply (Vcc) and a capacitive load (Cload) configured to provide a current corresponding to a current push (Ipush); and
    a second resistor is coupled between a capacitive load (Cload) and ground supply (Vss) configured to provide a current pull (Ipull)), further forming a low pass filter of the positive output side push-pull with low pass filter circuit, the positive output side push-pull with low pass filter circuit further being configured to have a sum of pushing current and pulling current equal a constant value (Ipush+Ipull=Constant).

11. A square wave to pseudo-sinusoidal clock conversion circuit comprising:
    a first stage, wherein the first stage comprises a cross-coupled differential pair input gain stage having a first transistor of first conductivity type configured on an output positive side of the first stage as an active load and being controlled via a gate bias voltage for the active load which comes from a diode-connected transistor of the first conductivity type doing current mirroring and acting as an active load for an outer differential pair of first and second transistors of a second conductivity type, the first transistor of second conductivity type being configured as a negative input side transistor of the outer differential pair of first and second transistors which is cross-coupled with an inner differential pair of third and fourth transistors, wherein the first stage includes a positive input side and a negative input side, the first stage being configured to receive a differential square wave clock input across the positive input side and the negative input side, wherein responsive to the differential square wave clock input, the first stage is configured to (i) saturate a weak differential square wave clock input to a large swing, (ii) perform input clock buffering and removal of high frequency glitches from the input clock, and (iii) provide a first pass attempt to create a balanced differential clock with pull-up and pull-down symmetry;
    a second stage, wherein the second stage comprises a positive output side push-pull with low pass filter circuit and a negative output side push-pull with low pass filter circuit, wherein the positive and negative output side push-pull with low pass filter circuits are responsive to the first pass attempt balanced differential clock from the first stage for producing an output pseudo-sinusoidal clock that comprises a nearly sinusoidal output with slew rate and clock waveform pull-up and pull-down symmetry for each of a respective one of the positive and negative output sides, wherein each output side push-pull with low pass filter circuit of the second stage is configured to (i) provide a push-pull strongly balanced pull-up and pull-down symmetrical waveform, and (ii) attenuate the symmetrical waveform by a low pass filtering in a push-pull process of the push-pull with low pass filter circuit to produce the output pseudo-sinusoidal clock that comprises a nearly sinusoidal output with slew rate controlled and clock waveform pull-up and pull-down symmetry for each of a respective one of the positive and negative output sides, the first stage and second stage together including resistors configured to provide active inductive peaking to boost an amplification and buffering of the square wave to pseudo-sinusoidal clock conversion circuit for multi-GHz bandwidth performance;

a positive output side floating bias circuit for providing a floating bias to the negative output side push-pull with low pass filter circuit; and a negative output side floating bias circuit for providing a floating bias to the positive output side push-pull with low pass filter circuit.

12. The circuit of claim 11 wherein the positive output side push-pull with low pass filter circuit of the second stage comprises a first resistor coupled between a voltage supply (Vcc) and a capacitive load (Cload) configured to provide a current corresponding to a current push (Ipush) and a second resistor coupled between the capacitive load (Cload) and ground supply (Vss) configured to provide a current pull (Ipull), further forming a low pass filter of the positive output side push-pull with low pass filter circuit, the positive output side push-pull with low pass filter circuit further being configured to have a sum of pushing current and pulling current equal to a constant value (Ipush+Ipull=Constant).

13. The circuit of claim 12, wherein each of the positive and negative output side push-pull with low pass filter circuit of the second stage is configured to (i) provide a push-pull strongly balanced pull-up and pull-down symmetrical waveform, and (ii) attenuate the symmetrical waveform by a low pass filtering in a push-pull process of the push-pull with low pass filter circuit to produce the output pseudo-sinusoidal clock that comprises a nearly sinusoidal output with slew rate controlled and clock waveform pull-up and pull-down symmetry for each of a respective one of the positive and negative output sides.

14. A method of implementing square wave to pseudo-sinusoidal clock conversion comprising:

providing a first stage, wherein the first stage comprises a cross-coupled differential pairs input gain stage and includes a positive input side and a negative input side, the first stage being configured to receive a differential square wave clock input across the positive input side and the negative input side, wherein responsive to the differential square wave clock input, the first stage is configured to provide a first pass attempt to create a balanced differential clock with pull-up and pull-down symmetry, the first stage being configured to saturate the weak clock input to a large swing, the first stage further comprising a first transistor of a first conductivity type configured on an output positive side of the first stage as an active load for the cross-coupled differential pair input gain stage, the first transistor of first conductivity type being controlled via a gate bias voltage for the active load which comes from a first diode-connected transistor having the first conductivity type doing current mirroring and acting as an active load for an outer differential pair of first and second transistors of a second conductivity type, the first transistor of the second conductivity type configured as a negative input side second conductivity type transistor of the outer differential pair of first and second transistors of second conductivity type, which is cross-coupled with an inner differential pair of third and fourth transistors of second conductivity type;

providing a second stage, wherein the second stage comprises a positive output side push-pull with low pass filter circuit and a negative output side push-pull with low pass filter circuit, wherein the positive and negative output side push-pull with low pass filter circuits are responsive to the first pass attempt balanced differential clock from the first stage for producing an output pseudo-sinusoidal clock that comprises a nearly sinusoidal output with slew rate controlled and clock waveform pull-up and pull-down symmetry for each of a respective one of the positive and negative output sides;

providing a positive output side floating bias circuit, wherein the positive output side floating bias circuit is configured to provide a floating bias to the negative output side push-pull with low pass filter circuit of the second stage; and providing a negative output side floating bias circuit, wherein the negative output side floating bias circuit is configured to provide a floating bias to the positive output side push-pull with low pass filter circuit of the second stage, wherein the first and second stages together include resistors configured to provide for active inductive peaking to boost an amplification and buffering of the square wave to pseudo-sinusoidal clock conversion circuit for multi-GHz bandwidth performance.

15. The method of claim 14, further comprising:

implementing the positive output side push-pull with low pass filter circuit of the second stage with a first resistor coupled between a voltage supply (Vcc) and a capacitive load (Cload) configured to provide a current corresponding to a current push (Ipush) and a second resistor coupled between the capacitive load (Cload) and a ground supply (Vss) configured to provide a current pull (Ipull), thereby forming a low pass filter of the positive output side push-pull with low pass filter circuit, the positive output side push-pull with low pass filter circuit further being configured to have a sum of pushing current and pulling current that is equal to a constant value (Ipush+Ipull=Constant).

* * * * *